(12) United States Patent
Conley et al.

(10) Patent No.: US 7,882,299 B2
(45) Date of Patent: Feb. 1, 2011

(54) SYSTEM AND METHOD FOR USE OF ON-CHIP NON-VOLATILE MEMORY WRITE CACHE

(75) Inventors: Kevin M. Conley, San Jose, CA (US); Yoram Cedar, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 861 days.

(21) Appl. No.: 11/021,200

(22) Filed: Dec. 21, 2004

(65) Prior Publication Data

US 2006/0136656 A1 Jun. 22, 2006

(51) Int. Cl.
G06F 12/00 (2006.01)
G06F 13/00 (2006.01)
G06F 13/28 (2006.01)

(52) U.S. Cl. .............................. 711/103; 711/E12.017; 711/113; 711/118

(58) Field of Classification Search .................. 711/203
See application file for complete search history.

(56) References Cited

U.S. PATENT DOCUMENTS

| | | | |
|---|---|---|---|
| 4,725,945 A | 2/1988 | Kronstadt et al. | |
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,276,829 A * | 1/1994 | Sano ........................... | 711/210 |
| 5,313,421 A | 5/1994 | Guterman et al. | |
| 5,315,541 A | 5/1994 | Harari et al. | |
| 5,343,063 A | 8/1994 | Yuan et al. | |
| 5,418,752 A | 5/1995 | Harari et al. | |
| 5,438,549 A * | 8/1995 | Levy ........................... | 365/229 |
| 5,530,673 A * | 6/1996 | Tobita et al. ........... | 365/185.09 |
| 5,532,962 A | 7/1996 | Auclair et al. | |
| 5,570,315 A | 10/1996 | Tanaka et al. | |
| 5,586,291 A * | 12/1996 | Lasker et al. ................. | 711/113 |
| 5,606,532 A | 2/1997 | Lambrache et al. | |
| 5,661,053 A | 8/1997 | Yuan | |
| 5,677,872 A | 10/1997 | Samachisa et al. | |

(Continued)

FOREIGN PATENT DOCUMENTS

EP 0557968 9/1993

(Continued)

OTHER PUBLICATIONS

Kenichi Imamiya et al., "A 125-mm2 1-Gb NAND Flash Memory With 10-MByte/s Program Speed." May 20, 2002. IEEE. p. 1-11.*

(Continued)

*Primary Examiner*—Matt Kim
*Assistant Examiner*—Matthew R Chrzanowski
(74) *Attorney, Agent, or Firm*—Weaver Austin Villeneuve & Sampson LLP

(57) ABSTRACT

A method of programming a non-volatile memory array using an on-chip write cache is disclosed. Individual data packets received by the memory system are stored in cache memory. More than one data packet may be stored in this way and then programmed to a single page of the non-volatile array. This results in more efficient use of storage space in the non-volatile array.

26 Claims, 11 Drawing Sheets

U.S. PATENT DOCUMENTS

| | | | |
|---|---|---|---|
| 5,712,179 A | | 1/1998 | Yuan |
| 5,726,937 A | * | 3/1998 | Beard .................... 365/185.33 |
| 5,765,185 A | | 6/1998 | Lambrache et al. |
| 5,774,397 A | | 6/1998 | Endoh et al. |
| 5,798,968 A | | 8/1998 | Lee et al. |
| 5,802,554 A | * | 9/1998 | Caceres et al. ............... 711/103 |
| 5,890,192 A | | 3/1999 | Lee et al. |
| 5,909,449 A | | 6/1999 | So |
| 5,930,167 A | | 7/1999 | Lee et al. |
| 5,936,971 A | * | 8/1999 | Harari et al. ................ 714/710 |
| 5,937,423 A | | 8/1999 | Robinson |
| 5,956,744 A | * | 9/1999 | Robertson et al. ........... 711/122 |
| 5,996,047 A | * | 11/1999 | Peacock .................... 711/118 |
| 6,000,006 A | * | 12/1999 | Bruce et al. ................. 711/103 |
| 6,026,027 A | * | 2/2000 | Terrell et al. ........... 365/185.33 |
| 6,035,347 A | * | 3/2000 | Beardsley et al. ............. 710/52 |
| 6,046,935 A | | 4/2000 | Takeuchi et al. |
| 6,078,520 A | * | 6/2000 | Tobita et al. ........... 365/185.09 |
| 6,222,762 B1 | | 4/2001 | Guterman et al. |
| 6,249,841 B1 | | 6/2001 | Sikes et al. |
| 6,263,398 B1 | | 7/2001 | Taylor et al. |
| 6,272,587 B1 | * | 8/2001 | Irons ......................... 711/103 |
| 6,329,687 B1 | * | 12/2001 | Sobek et al. ................. 257/314 |
| 6,349,056 B1 | | 2/2002 | Conley |
| 6,405,323 B1 | * | 6/2002 | Lin et al. ....................... 714/8 |
| 6,412,045 B1 | * | 6/2002 | DeKoning et al. .......... 711/135 |
| 6,426,893 B1 | | 7/2002 | Conley et al. |
| 6,434,669 B1 | | 8/2002 | Arimilli et al. |
| 6,456,528 B1 | * | 9/2002 | Chen ..................... 365/185.03 |
| 6,470,422 B2 | | 10/2002 | Cai et al. |
| 6,483,748 B2 | | 11/2002 | Futatsuya et al. |
| 6,510,495 B1 | | 1/2003 | Nobukiyo |
| 6,522,580 B2 | | 2/2003 | Chen et al. |
| 6,523,132 B1 | * | 2/2003 | Harari et al. .................... 714/8 |
| 6,549,977 B1 | * | 4/2003 | Horst et al. ................. 711/113 |
| 6,560,143 B2 | | 5/2003 | Conley et al. |
| 6,601,137 B1 | * | 7/2003 | Castro et al. ................ 711/113 |
| 6,611,938 B1 | * | 8/2003 | Tanaka et al. ............... 714/763 |
| 6,647,499 B1 | | 11/2003 | Morcom |
| 6,717,847 B2 | | 4/2004 | Chen |
| 6,721,843 B1 | | 4/2004 | Estakhri |
| 6,725,321 B1 | * | 4/2004 | Sinclair et al. .............. 711/103 |
| 6,763,424 B2 | | 7/2004 | Conley |
| 6,791,877 B2 | | 9/2004 | Miura et al. |
| 6,798,353 B2 | | 9/2004 | Seal et al. |
| 6,822,899 B1 | * | 11/2004 | Boulos et al. .......... 365/185.09 |
| 6,836,816 B2 | * | 12/2004 | Kendall .......................... 711/3 |
| 6,880,043 B1 | * | 4/2005 | Castro et al. ................ 711/103 |
| 6,941,412 B2 | | 9/2005 | Gongwer et al. |
| 6,941,414 B2 | | 9/2005 | Hsu et al. |
| 6,968,421 B2 | | 11/2005 | Conley |
| 7,099,993 B2 | * | 8/2006 | Keeler ........................ 711/113 |
| 7,113,432 B2 | * | 9/2006 | Mokhlesi ............... 365/185.33 |
| 7,127,560 B2 | * | 10/2006 | Cohen et al. ................. 711/141 |
| 7,480,760 B2 | * | 1/2009 | Bernstein et al. ............. 711/103 |
| 2001/0012222 A1 | * | 8/2001 | Terasaki ...................... 365/200 |
| 2001/0025333 A1 | * | 9/2001 | Taylor et al. ................. 711/103 |
| 2001/0034809 A1 | * | 10/2001 | Ogawa ........................ 711/103 |
| 2001/0052060 A1 | | 12/2001 | Bao |
| 2002/0013874 A1 | | 1/2002 | Gelke et al. |
| 2002/0051394 A1 | * | 5/2002 | Tobita et al. ................. 365/221 |
| 2002/0097594 A1 | * | 7/2002 | Bruce et al. .................... 365/49 |
| 2002/0144059 A1 | * | 10/2002 | Kendall ....................... 711/118 |
| 2002/0174291 A1 | | 11/2002 | Hsu et al. ..................... 711/105 |
| 2002/0185337 A1 | | 12/2002 | Miura et al. ................... 185/11 |
| 2003/0109093 A1 | | 6/2003 | Harari et al. |
| 2003/0163629 A1 | * | 8/2003 | Conley et al. ................ 711/103 |
| 2003/0201904 A1 | * | 10/2003 | Seal et al. ............... 340/870.02 |
| 2003/0233513 A1 | | 12/2003 | Ezoe ........................... 711/103 |
| 2004/0030971 A1 | | 2/2004 | Tanaka et al. ................ 714/718 |
| 2004/0193782 A1 | * | 9/2004 | Bordui ........................ 711/103 |
| 2004/0213045 A1 | * | 10/2004 | Nakai ..................... 365/185.13 |
| 2005/0050261 A1 | * | 3/2005 | Roehr et al. ................. 711/103 |
| 2005/0066121 A1 | * | 3/2005 | Keeler ........................ 711/113 |
| 2005/0080994 A1 | * | 4/2005 | Cohen et al. ................. 711/118 |
| 2005/0125601 A1 | * | 6/2005 | Ehrlich ........................ 711/112 |
| 2005/0144360 A1 | * | 6/2005 | Bennett et al. ............... 711/103 |
| 2005/0251617 A1 | * | 11/2005 | Sinclair et al. ............... 711/103 |
| 2005/0257120 A1 | | 11/2005 | Gorobets et al. |
| 2005/0268025 A1 | | 12/2005 | Smith et al. |
| 2006/0161722 A1 | * | 7/2006 | Bennett et al. ............... 711/103 |

FOREIGN PATENT DOCUMENTS

| | | | |
|---|---|---|---|
| EP | 557968 A2 | * | 9/1993 |
| EP | 0566306 | | 10/1993 |
| EP | 566306 A2 | * | 10/1993 |
| WO | WO 02/05285 A2 | | 1/2002 |
| WO | 2006/068916 | | 6/2009 |

OTHER PUBLICATIONS

Jim Handy, "The Cache Memory book: The authoritative reference on cache design," 1998. Second Edition, pp. 177-179, 183-184.*

Notification of Transmittal of the International Search Report and the Written Opinion of the International Searching Authority, or the Declaration for corresponding International Application No. PCT/US2005/045431, mailed Jun. 7, 2006, 14 pages.

Office Action mailed Jun. 17, 2008 in European Application No. 05854199.6.

Office Action mailed Sep. 30, 2008 in Korean Application No. 2007-7014037.

Office Action mailed Nov. 4, 2008 in European Application No. 05854199.6.

Office Action mailed Mar. 19, 2009 in European Application No. 05854199.6.

Notice of Final Rejection mailed Jul. 31, 2009 in Korean Application No. 2007-7014037.

* cited by examiner

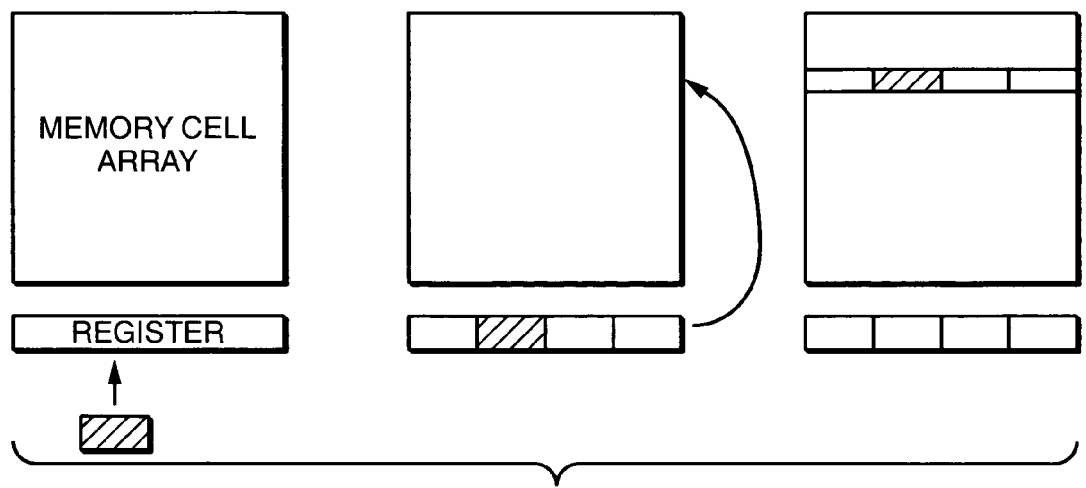
FIG._1A
*(PRIOR ART)*
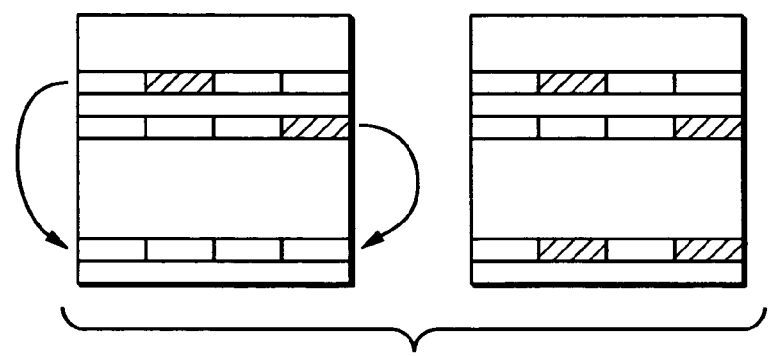
FIG._1B
*(PRIOR ART)*

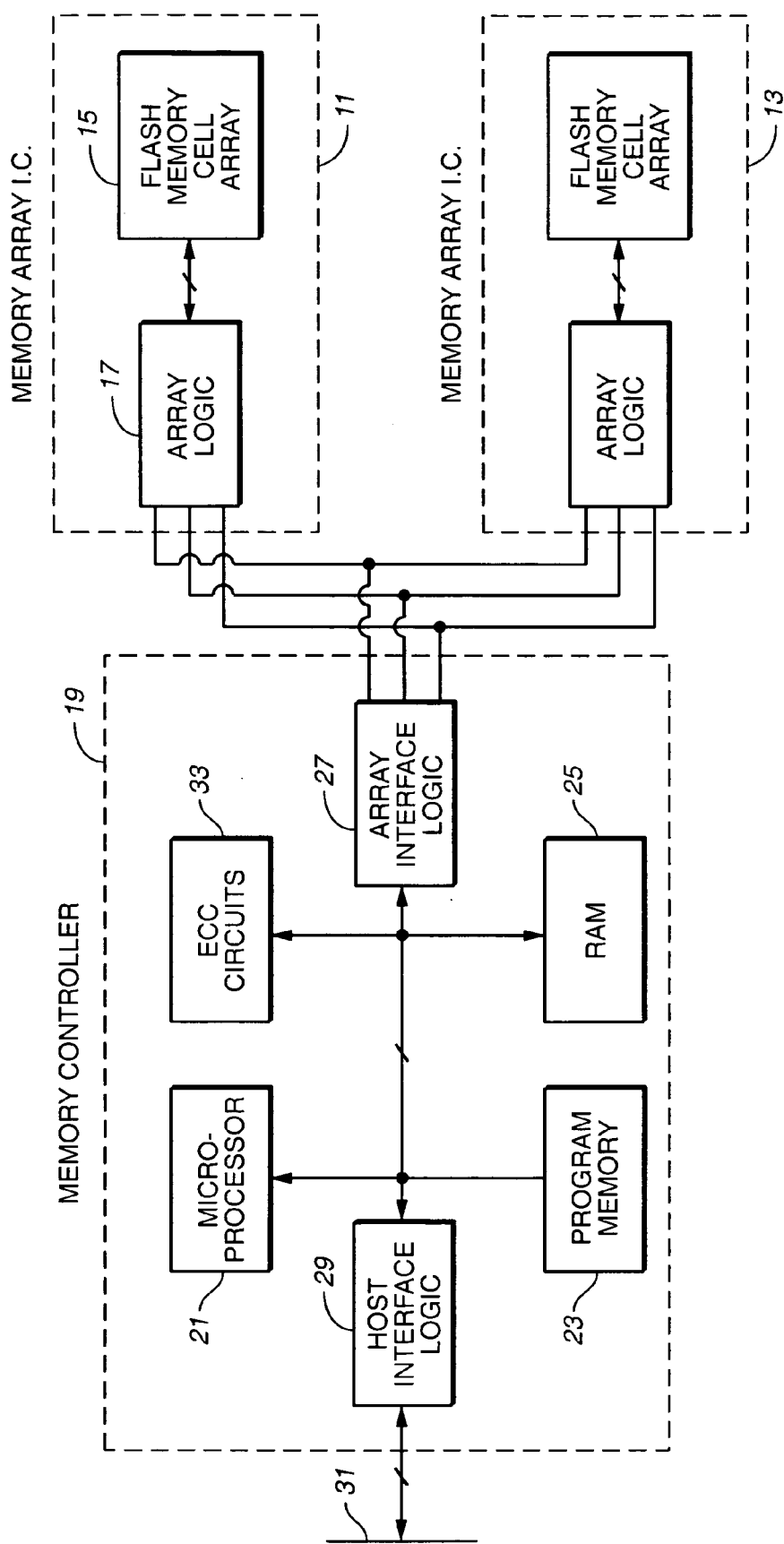
FIG._2A

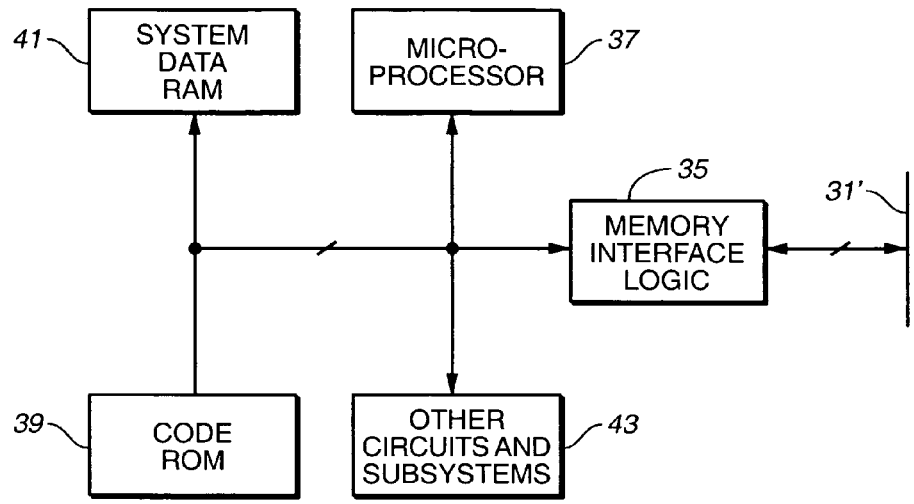
FIG._2B
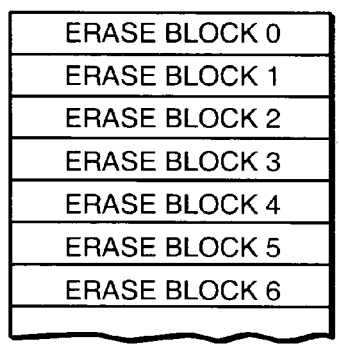
FIG._3A
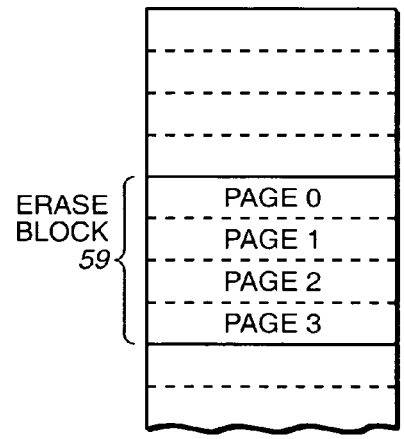
FIG._4
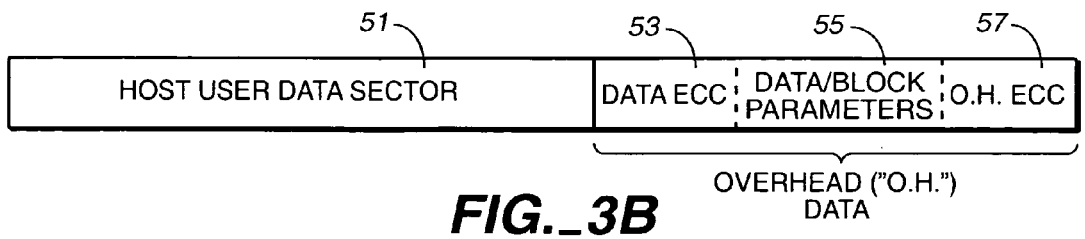
FIG._3B

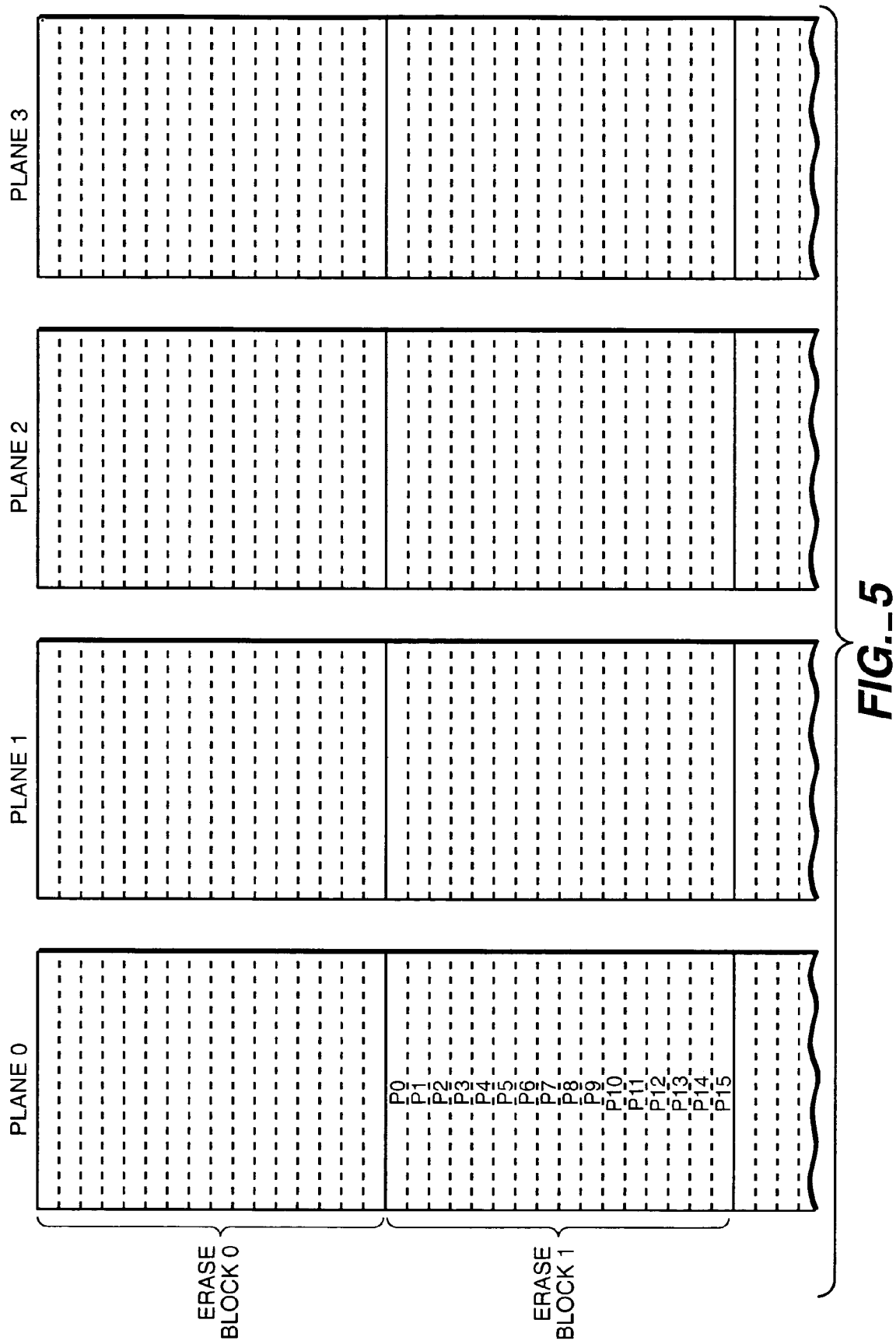
FIG._5

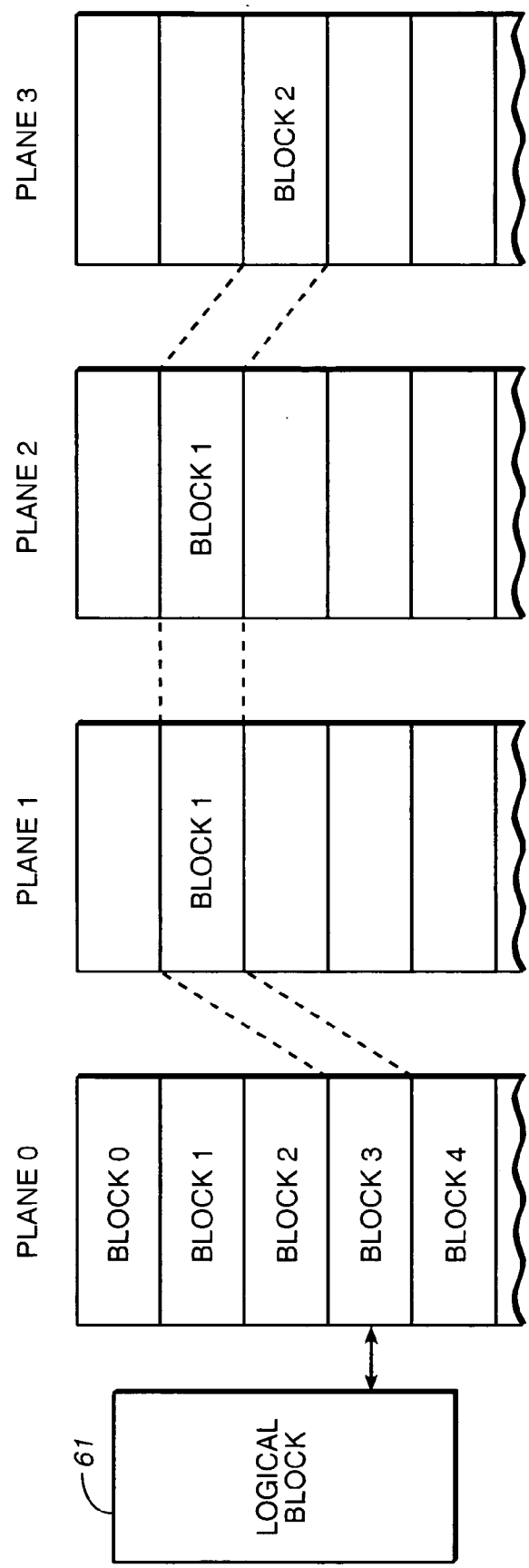
FIG._6

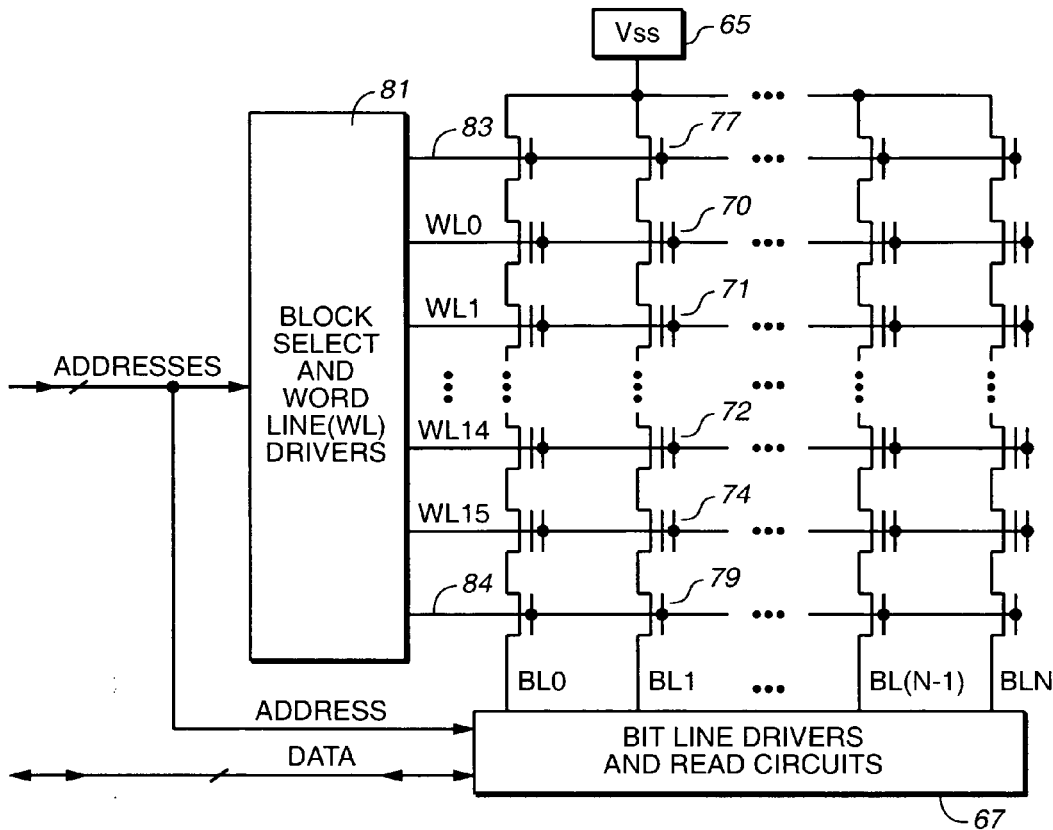
FIG._7
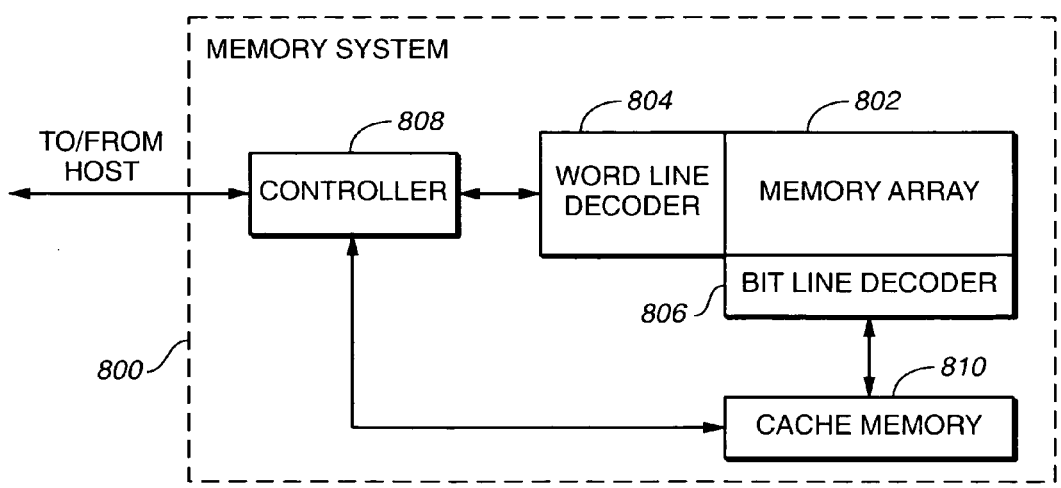
FIG._8

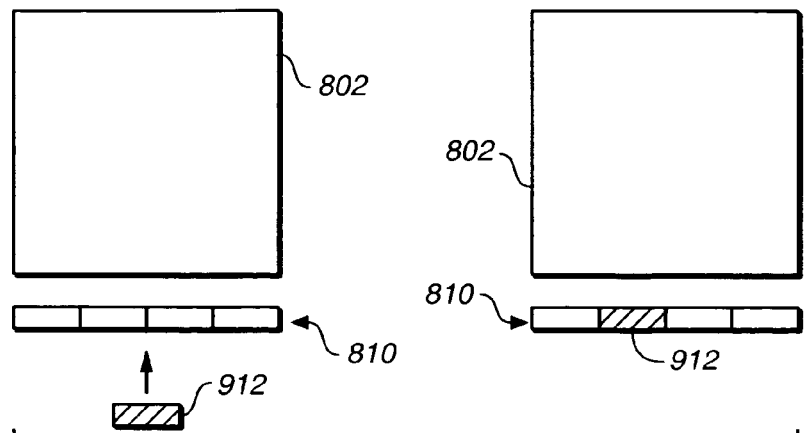
FIG._9A
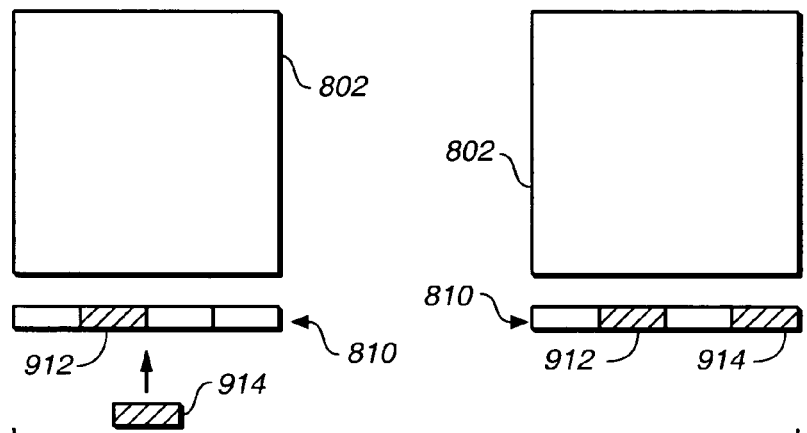
FIG._9B
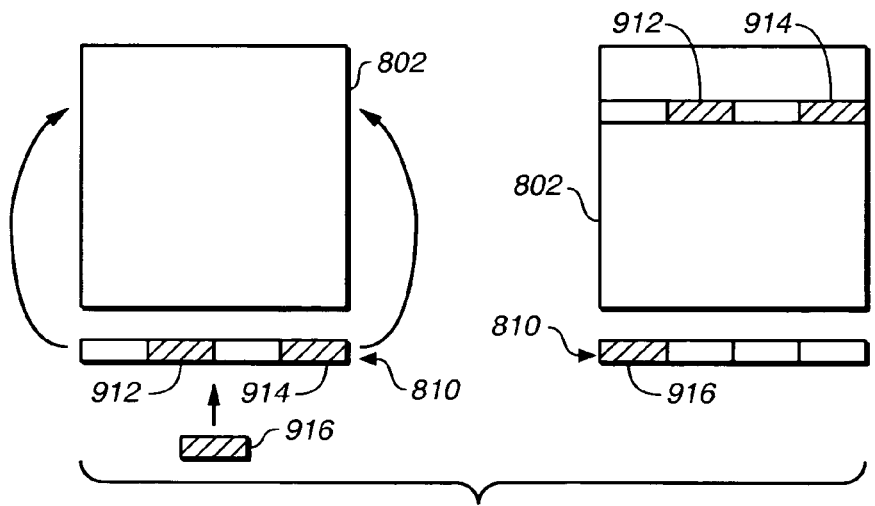
FIG._9C

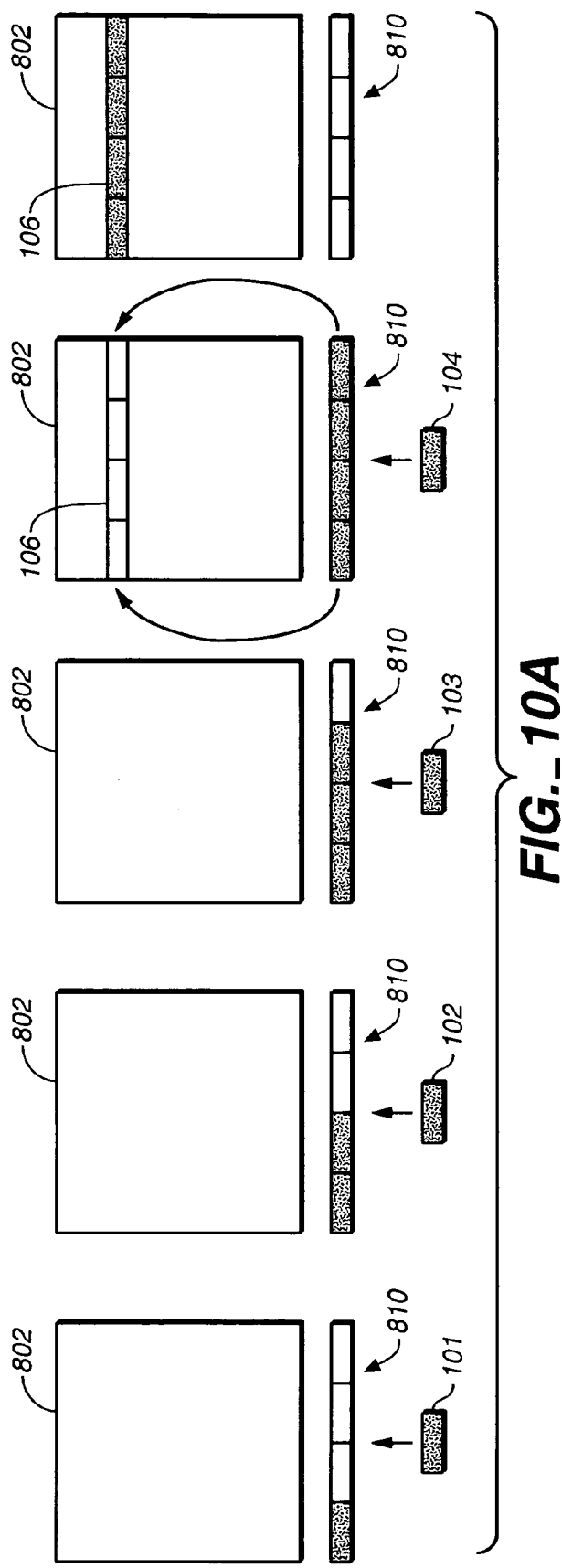
FIG._10A

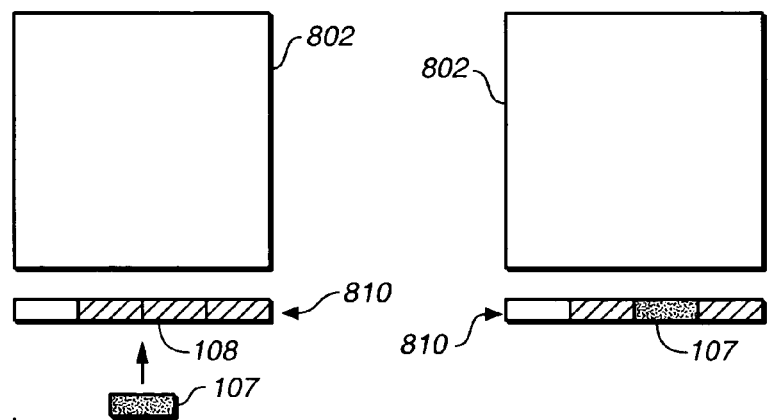
FIG._10B
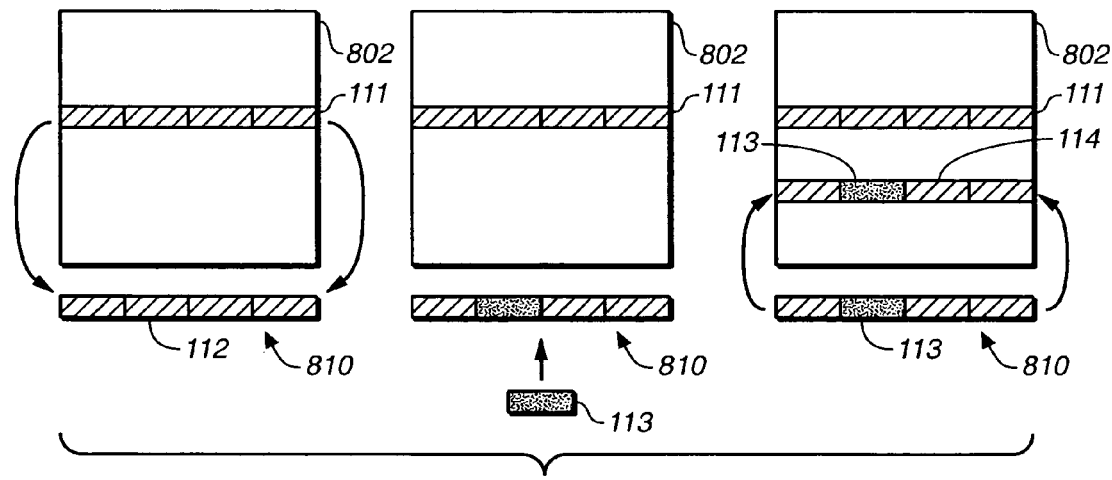
FIG._11

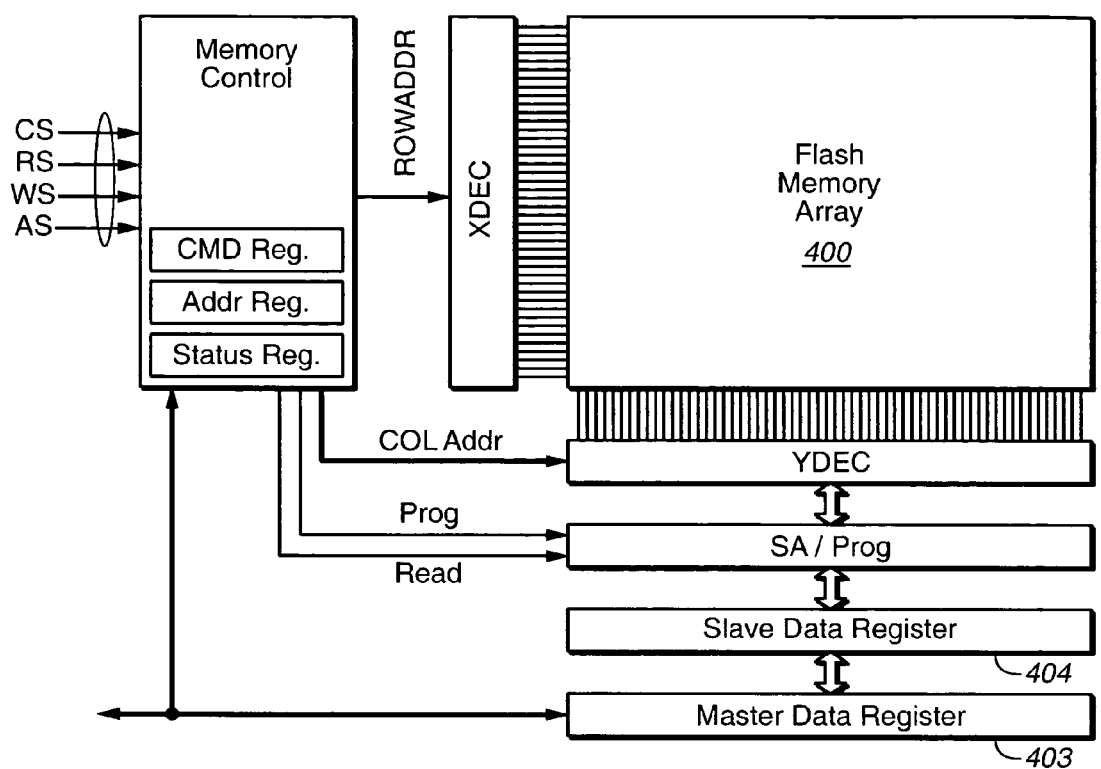
FIG._12

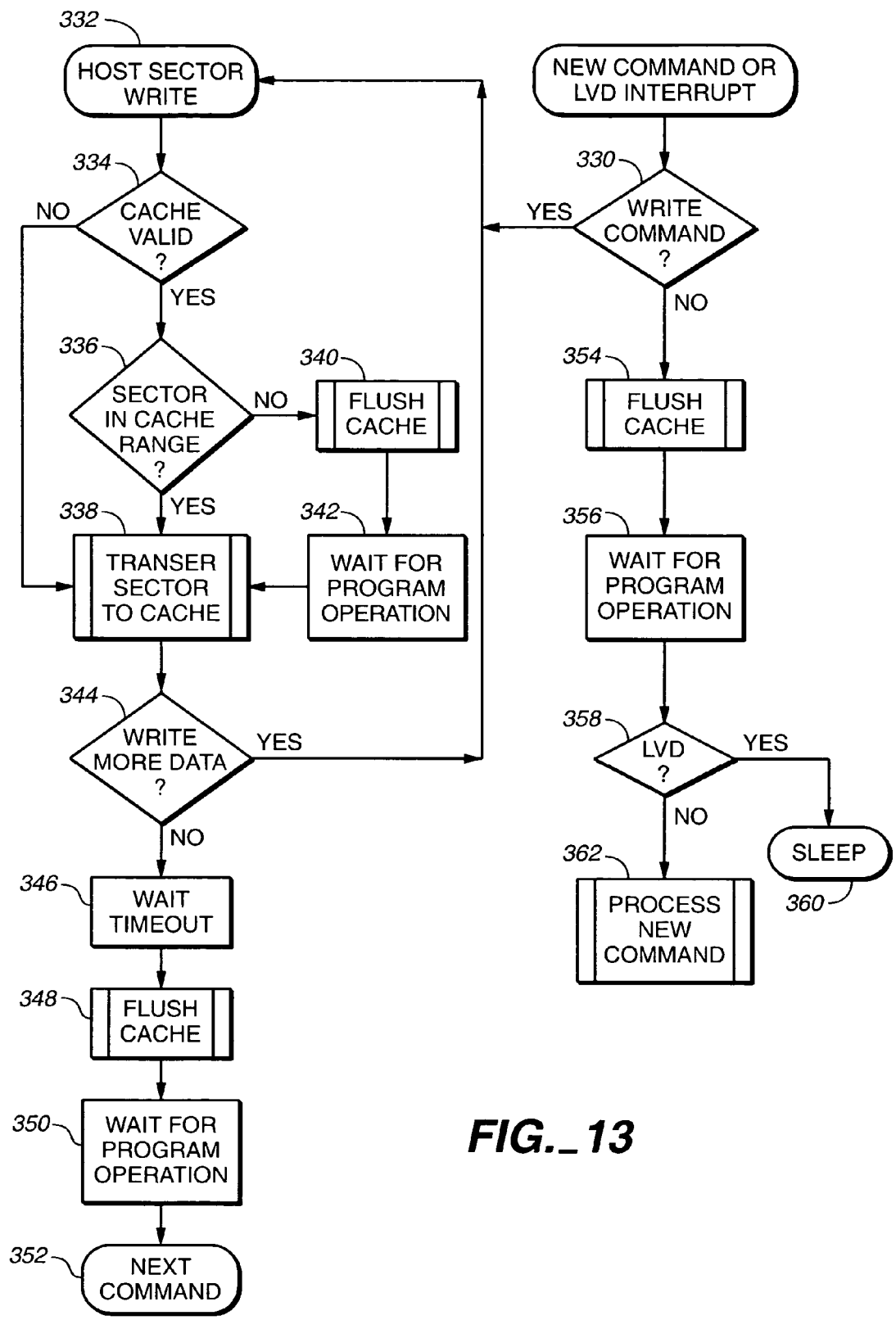
FIG._13

SYSTEM AND METHOD FOR USE OF ON-CHIP NON-VOLATILE MEMORY WRITE CACHE

BACKGROUND

This invention relates generally to semiconductor memory systems, particularly to non-volatile memory systems, and has application to data storage systems based on flash electrically-erasable and programmable read-only memories (EEPROMS).

There are many commercially successful non-volatile memory products being used today, particularly in the form of small form factor cards, which employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some program memory such as non-volatile read-only-memory (ROM), a volatile random-access-memory (RAM) and one or more special circuits such as one that calculates an error-correction-code (ECC) from data as they pass through the controller during the programming and reading of data. Some of the commercially available cards are CompactFlash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. Besides the memory card implementation, this type of memory can alternatively be embedded into various types of host systems.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762, which patents, along with all patents and patent applications cited in this application, are hereby incorporated by reference in their entirety.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in United States patent application publication no. 2003/0109093 of Harari et al.

As in most all integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, and for structures using dielectric floating gates in aforementioned United States patent application publication no. 2003/0109093. Selected portions of a multi-state memory cell array may also be operated in two states (binary) for various reasons, in a manner described in U.S. Pat. Nos. 5,930,167 and 6,456,528.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism, and thus improve performance, during programming user data into the memory array and reading user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, blocks may be linked together to form virtual blocks or metablocks. That is, each metablock is defined to include one block from each plane. Use of the metablock is described in U.S. Pat. No. 6,763,424, which patent, along with all other patents and patent applications referred to in this application, is hereby incorporated by reference. The metablock is identified by a host logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

Data stored in a metablock are often updated, the likelihood of updates as the data capacity of the metablock increases. Updated sectors of one metablock are normally written to another metablock. The unchanged sectors are usually also copied from the original to the new metablock, as part of the same programming operation, to consolidate the data. Alternatively, the unchanged data may remain in the original metablock until later consolidation with the updated data into a single metablock again.

It is common to operate large block or metablock systems with some extra blocks maintained in an erased block pool. When one or more pages of data less than the capacity of a block are being updated, it is typical to write the updated pages to an erased block from the pool and then copy data of the unchanged pages from the original block to erase pool block. Variations of this technique are described in aforementioned U.S. Pat. No. 6,763,424. Over time, as a result of host data files being re-written and updated, many blocks can end up with a relatively few number of its pages containing valid data and remaining pages containing data that is no longer current. In order to be able to efficiently use the data storage capacity of the array, logically related data pages of valid data are from time-to-time gathered together from fragments among multiple blocks and consolidated together into a fewer number of blocks. This process is commonly termed "garbage collection."

In some memory systems, the physical memory cells are also grouped into two or more zones. A zone may be any partitioned subset of the physical memory or memory system into which a specified range of logical block addresses is mapped. For example, a memory system capable of storing 64 Megabytes of data may be partitioned into four zones that store 16 Megabytes of data per zone. The range of logical block addresses is then also divided into four groups, one group being assigned to the physical blocks of each of the four zones. Logical block addresses are constrained, in a typical implementation, such that the data of each are never written outside of a single physical zone into which the logical block addresses are mapped. In a memory cell array divided into planes (sub-arrays), which each have their own addressing, programming and reading circuits, each zone preferably includes blocks from multiple planes, typically the same number of blocks from each of the planes. Zones are primarily used to simplify address management such as logical to physical translation, resulting in smaller translation tables, less RAM memory needed to hold these tables, and faster access times to address the currently active region of memory, but because of their restrictive nature can result in less than optimum wear leveling.

Individual flash EEPROM cells store an amount of charge in a charge storage element or unit that is representative of one or more bits of data. The charge level of a storage element controls the threshold voltage (commonly referenced as $V_T$) of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels do shift as a result of charge disturbing programming, reading or erasing operations performed in neighboring or other related memory cells, pages or blocks. Error correcting codes (ECCs) are therefore typically calculated by the controller and stored along with the host data being programmed and used during reading to verify the data and perform some level of data correction if necessary. Also, shifting charge levels can be restored back to the centers of their state ranges from time-to-time, before disturbing operations cause them to shift completely out of their defined ranges and thus cause erroneous data to be read. This process, termed data refresh or scrub, is described in U.S. Pat. Nos. 5,532,962 and 5,909,449.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

Since the programming of data into floating-gate memory cells can take significant amounts of time, a large number of memory cells in a row are typically programmed at the same time. The smallest amount of data that may be programmed as a single unit is one page. One page may comprise more than one sector. Thus, a single programming operation may program several sectors of the memory array at a time. Increases in parallelism cause increased power requirements and potential disturbances of charges of adjacent cells or interaction between them. U.S. Pat. Nos. 5,890,192 and 6,426,893 of SanDisk Corporation, which are incorporated herein in their entirety, describe systems that minimize these effects.

One or more registers may be used to move data into and out of a memory cell array. Examples of multiple register memory systems are described in U.S. Pat. Nos. 6,349,056 B1 and 6,560,143 B2. A register typically holds data equal to the data in one row of the memory cell array. A register is generally volatile and therefore any data in such a register is lost if there is a loss of power.

Cache memory may be used in conjunction with non-volatile memory arrays to speed up read and write operations. A read cache may store data that is frequently requested by the host. This reduces the number of times the non-volatile array is accessed. A write cache may be used to reduce the number of writes to the non-volatile array as described by Harari et al in U.S. Pat. No. 6,523,132, which is incorporated herein in its entirety. This may reduce wear on the non-volatile array by reducing the number of write operations required. Cache memories are generally part of the memory controller system and may be formed on the same chip as the controller. The non-volatile array is generally formed on a separate chip or may comprise two or more separate chips.

Where more than one bit of data is stored in a cell, small variations in stored charges may corrupt the stored data. This may prevent programming the same row more than once. Attempting to program an empty portion of the row could cause program disturbs in a programmed portion of the row by causing charge to be added to the floating gates of cells that have already been programmed. In some memory systems, each row of the memory cell array may be written only once, unless an erase is performed. Thus, a row of cells may define the minimum unit of programming (a page). In such memory systems, storing a single sector of data in the array may occupy a page that is capable of storing multiple sectors. For example, when the host sends a single sector, this sector is written to a page in the array as shown in FIG. 1A. The write operation leaves the remainder of the page empty. This empty space in the page is capable of holding three sectors of data in this example. Even if sectors are received sequentially, they may be programmed separately where there are delays between them. This results in inefficient use of the space available in the memory array.

One way to deal with this problem is to combine sectors that are stored in pages that are not full. For example, FIG. 1B shows two pages in the memory array, each of which is capable of storing four sectors of data. Each page only holds one sector of data because the sector was programmed as described above. The two stored sectors may be copied to a third page. Thus, the two sectors occupy just one page of space in the array instead of the two pages they previously occupied. However, the first two pages must still be erased before they can be used to store more data. This system involves additional steps to read the stored sectors from the first and second pages, write the combined sectors to a third page and then perform an erase on the block, or blocks containing the original sectors, in order to reuse the pages that they occupied. These operations may be done as part of garbage collection. While garbage collection allows data to be more efficiently configured within the memory array, it takes time and uses system resources thus imposing an unwanted overhead. As page sizes increase, garbage collection of such pages becomes an increasing overhead.

Therefore, a need exists for a more efficient way to store data in a memory array when the data is received in individual addressable data packets that are smaller than the minimum unit of programming of the memory array.

SUMMARY OF THE INVENTION

An efficient method of storing data in non-volatile memory uses a cache memory connected to the non-volatile memory array. This allows addressable data packets sent to the memory system to be assembled into larger units of data for programming to the memory array. For example, an individual sector sent to the memory system is not immediately programmed to the memory array. Instead, it is stored in the cache memory. When another sector of data is received, the two sectors are compared to see if they may be programmed together in a single page. If they may be programmed in the same page, then the new sector is stored in the cache memory with the cached sector. The next sector to be received is similarly compared with the two cached sectors and is stored in cache memory if it may be programmed together with the cached sectors. When a sector is received that cannot be programmed in the same page as the cached sectors, the cached sectors are programmed to the non-volatile memory thus emptying the cache memory. The newly received sector is then stored in the cache memory. Thus, two sectors are programmed together in a single page instead of programming two pages each containing one sector of data. This example involves programming just two sectors in a page. However, more than two sectors may be programmed to a single page in this manner. Where a page contains four sectors of data, as many as four sectors may be programmed together in this way.

As well as programming to the non-volatile memory when new data is received that is not programmable with the cached data, programming may be triggered by other events. For example, where a volatile memory is used as the cache memory, the cached data may be programmed to the array when a low power condition is detected. This prevents the loss of the data stored in the volatile cache when the power is removed. Alternatively, a non-volatile memory may be used as the cache. Cached data may also be written to the array after a certain period of inactivity.

The cache memory may be on the same chip as the non-volatile memory. The cache memory may be implemented using registers that are already part of many non-volatile memory systems. For example, the cache memory system may use registers like those described in U.S. Pat. No. 6,426,893.

BRIEF DESCRIPTION OF THE DRAWINGS

FIG. 1A shows programming of a sector of data according to the prior art.

FIG. 1B shows garbage collection of programmed pages according to the prior art.

FIGS. 2A and 2B are block diagrams of a non-volatile memory and a host system, respectively, that operate together.

FIG. 3A illustrates a first example organization of the memory array of FIG. 2A.

FIG. 3B shows an example host data sector with overhead data as stored in the memory array of FIG. 2A.

FIG. 4 illustrates a second example organization of the memory array of FIG. 2A.

FIG. 5 illustrates a third example organization of the memory array of FIG. 2A;

FIG. 6 shows an extension of the third example organization of the memory array of FIG. 2A;

FIG. 7 is a circuit diagram of a group of memory cells of the array of FIG. 2A in one particular configuration;

FIG. 8 shows a memory system using a cache memory;

FIG. 9A shows a first sector being received by a memory system and being stored in the cache memory.

FIG. 9B shows a second sector being received by a memory system being stored in the cache memory with the first sector.

FIG. 9C shows a third sector being received by a memory system and being stored in the cache memory, the first two sectors being programmed to the memory array.

FIG. 10A shows sequential single sectors being received by a memory system having a cache memory.

FIG. 10B shows a sector being received that replaces a sector of data that is stored in the cache memory.

FIG. 11 shows a read-modify-write sequence for updating a page of data.

FIG. 12 shows a memory system that is suitable for implementing an on-chip cache.

FIG. 13 shows a flowchart for an embodiment of the present invention.

DESCRIPTION OF EXEMPLARY EMBODIMENTS

Memory Architectures and Their Operation

Referring initially to FIG. 2A, a flash memory includes a memory cell array and a controller. In the example shown, two integrated circuit devices (chips) 11 and 13 include an array 15 of memory cells and various logic circuits 17. The logic circuits 17 interface with a controller 19 on a separate chip through data, command and status circuits, and also provide addressing, data transfer and sensing, and other support to the array 13. A number of memory array chips can be from one to many, depending upon the storage capacity provided. The controller and part or the entire array can alternatively be combined onto a single integrated circuit chip but this is currently not an economical alternative.

A typical controller 19 includes a microprocessor 21, a program memory 23 primarily to store firmware and a data buffer memory (RAM) 25 primarily for the temporary storage of user data either being written to or read from the memory chips 11 and 13. A program memory may be either volatile or non-volatile. Program memory is dedicated to storage of data for controller operation. In one example, program memory is a Read Only Memory (ROM). Circuits 27 interface with the memory array chip(s) and circuits 29 interface with a host though connections 31. The integrity of data is in this example determined by calculating an ECC with circuits 33 dedicated to calculating the code. As user data is being transferred from the host to the flash memory array for storage, the circuit calculates an ECC from the data and the code is stored in the memory. When that user data are later read from the memory, they are again passed through the circuit 33, which calculates the ECC by the same algorithm and compares that code with the one calculated and stored with the data. If they compare, the integrity of the data is confirmed. If they differ, depending upon the specific ECC algorithm utilized, those bits in error, up to a number supported by the algorithm, can be identified and corrected.

The connections 31 of the memory of FIG. 2A mate with connections 31' of a host system, an example of which is given in FIG. 2B. Data transfers between the host and the memory of FIG. 2A are through interface circuits 35. A typical host also includes a microprocessor 37, a ROM 39 for storing firmware code and RAM 41. Other circuits and subsystems 43 often include a high capacity magnetic data storage disk drive, interface circuits for a keyboard, a monitor and the like, depending upon the particular host system. Some examples of such hosts include desktop computers, laptop computers, handheld computers, palmtop computers, personal digital assistants (PDAs), MP3 and other audio players, digital cameras, video cameras, electronic game machines, wireless and wired telephony devices, answering machines, voice recorders, network routers and others.

The memory of FIG. 2A may be implemented as a small enclosed card containing the controller and all its memory array circuit devices in a form that is removably connectable with the host of FIG. 2B. That is, mating connections 31 and 31' allow a card to be disconnected and moved to another host, or replaced by connecting another card to the host. Alternatively, the memory array devices may be enclosed in a separate card that is electrically and mechanically connectable with a card containing the controller and connections 31. As a further alternative, the memory of FIG. 2A may be embedded within the host of FIG. 2B, wherein the connections 31 and 31' are permanently made. In this case, the memory is usually contained within an enclosure of the host along with other components.

FIG. 3A illustrates a portion of a memory array wherein memory cells are grouped into blocks, the cells in each block being erasable together as part of a single erase operation, usually simultaneously. A block is the minimum unit of erase.

The size of the individual memory cell blocks of FIG. 3A can vary but one commercially practiced form includes a single sector of data in an individual block. The contents of such a data sector are illustrated in FIG. 3B. User data 51 are typically 512 bytes. In addition to the user data 51 are overhead data that includes an ECC 53 calculated from the user data, parameters 55 relating to the sector data and/or the block in which the sector is programmed and an ECC 57 calculated from the parameters 55 and any other overhead data that might be included.

The parameters 55 may include an indication of the bit values assigned to each of the storage states of the memory cells, referred to as their "rotation". This also has a beneficial effect in wear leveling. One or more flags may also be included in the parameters 55 that indicate status or states. Indications of voltage levels to be used for programming and/or erasing the block can also be stored within the parameters 55, these voltages being updated as the number of cycles experienced by the block and other factors change. Other examples of the parameters 55 include an identification of any defective cells within the block, the logical address of the block that is mapped into this physical block and the address of any substitute block in case the primary block is defective. The particular combination of parameters 55 that are used in any memory system will vary in accordance with the design. Also, some or all of the overhead data can be stored in blocks dedicated to such a function, rather than in the block containing the user data or to which the overhead data pertains.

Different from the single data sector block of FIG. 3A is a multi-sector block of FIG. 4. An example block 59, still the minimum unit of erase, contains four pages 0-3, each of which is the minimum unit of programming. One or more host sectors of data are stored in each page, usually along with overhead data including at least the ECC calculated from the sector's data and may be in the form of the data sector of FIG. 3B.

Re-writing the data of an entire block usually involves programming the new data into an erased block of an erase block pool, the original block then being erased and placed in the erase pool. When data of less than all the pages of a block are updated, the updated data are typically stored in a page of an erased block from the erased block pool and data in the remaining unchanged pages are copied from the original block into the new block. The original block is then erased. Variations of this large block management technique include writing the updated data into a page of another block without moving data from the original block or erasing it. This results in multiple pages having the same logical address. The most recent page of data is identified by some convenient technique such as the time of programming that is recorded as a field in sector or page overhead data.

A further multi-sector block arrangement is illustrated in FIG. 5. Here, the total memory cell array is physically divided into two or more planes, four planes 0-3 being illustrated. Each plane is a sub-array of memory cells that has its own data registers, sense amplifiers, addressing decoders and the like in order to be able to operate largely independently of the other planes. All the planes may be provided on a single integrated circuit device or on multiple devices, an example being to form each plane from one or more distinct integrated circuit devices. Each block in the example system of FIG. 5 contains 16 pages P0-P15, each page having a capacity of one, two or more host data sectors and some overhead data.

Yet another memory cell arrangement is illustrated in FIG. 6. Each plane contains a large number of blocks of cells. In order to increase the degree of parallelism of operation, blocks within different planes are logically linked to form metablocks. One such metablock is illustrated in FIG. 6 as being formed of block 3 of plane 0, block 1 of plane 1, block 1 of plane 2 and block 2 of plane 3. The memory controller assigns and keeps track of the blocks that form the individual metablocks. The host system preferably interfaces with the memory system in addressable units of data such as a sector. The memory controller may use other units of data that comprise multiple sectors. For example, a logical data block is a unit of data comprising data equal to the capacity of an individual metablock. Such a logical data block 61 of FIG. 6, for example, is mapped by the controller into the blocks that make up the metablock. All blocks of the metablock are erased together, and pages from each block are preferably programmed and read simultaneously.

In most flash memory systems, the controller maintains a record of the physical locations where portions of data (for example, sectors) are stored. A logical to physical mapping is performed so that the location of a particular sector in the non-volatile memory array may be determined. In many examples, data is written to a new physical location when it is updated so that the logical to physical information is also updated. Sectors of data may be maintained in sequential order in a block or may be written in non-sequential order as described in U.S. patent application Ser. No. 10/750,155, entitled "Non-volatile memory and method with block management system," which application is hereby incorporated by reference in its entirety.

There are many different memory array architectures, configurations and specific cell structures that may be employed to implement the memories described above with respect to FIGS. 3-6. One block of a memory array of the NAND type is shown in FIG. 7. A large number of column oriented strings of series connected memory cells are connected between a common source 65 of a voltage Vss and one of bit lines BL0-BLN that are in turn connected with circuits 67 containing address decoders, drivers, read sense amplifiers and the like. Specifically, one such string contains charge storage transistors 70, 71 . . . 72 and 74 connected in series between select transistors 77 and 79 at opposite ends of the strings. In this example, each string contains 16 storage transistors but other numbers are possible. Word lines WL0-WL15 extend across one storage transistor of each string and are connected to circuits 81 that contain address decoders and voltage source drivers of the word lines. Voltages on lines 83 and 84 control connection of all the strings in the block together to either the voltage source 65 and/or the bit lines BL0-BLN through their select transistors. Data and addresses come from the memory controller.

Each row of charge storage transistors (memory cells) of the block forms a page that is programmed and read together. An appropriate voltage is applied to the word line (WL) of such a page for programming or reading its data while voltages applied to the remaining word lines are selected to render their respective storage transistors conductive. In the course of programming or reading one row (page) of storage transistors, previously stored charge levels on unselected rows can be disturbed because of voltages applied across all the strings and to their word lines.

FIG. 8 shows an example of a memory system 800 utilizing the present invention. A memory array 802 has a word line decoder 804 and a bit line decoder 806 connected to memory array 802 along adjacent edges of memory array 802. Word line decoder 804 is connected to the controller 808. Bit line decoder 806 is connected to a cache memory 810. Cache memory 810 is connected to controller 808. Thus, cache memory 810 is in-line between controller 808 and bit line decoder 806. Data going between controller 808 and memory array 802 pass through cache memory 810. In particular, data sent from controller 808 for storage in memory array 802 pass through cache memory 810. Data may be stored in cache memory 810 before being written to memory array 802. Controller 808 is connected to a host in the example shown in FIG. 8. Memory systems of the type shown may be used in an enclosed card that is removably connected with a host system. For example, this memory system may be implemented in a card according to one of the standards discussed above (PC-MCIA, CF, MMC, SD). The host may be a digital camera, mobile phone or other device that uses memory cards. Alternatively, the memory system may be embedded in a host system.

FIG. 9A shows an addressable unit of data 912 being sent to cache memory 810 that is empty. One example of such an addressable unit is a sector of data comprising 512 bytes. In this example, a sector 912 is received from the host and is stored in the cache memory 810 instead of being written to memory array 802. This is in contrast to the prior art example of FIG. 1 where, after the sector is transferred to the register, it is written to the memory array. In FIG. 9A, sector 912 is stored in a cache memory 810 that may contain four sectors of data. This is because the size of one page (unit of program) for memory array 802 is four sectors. Memory arrays that have larger pages would require larger cache memories.

When the sector is stored in cache memory a signal may be sent to the host indicating that the sector has been programmed. This enables the host to send more data to the memory system. Because writing to a cache memory is quicker than writing to many non-volatile memory arrays, storing a sector in cache may improve system speed and allow the host to send another sector more rapidly than if a write operation was performed.

FIG. 9B shows another sector of data 914 being received by the cache memory of FIG. 9B. The new sector 914 and the cached sector 912 are compared to determine if they may be written to the memory array in the same page. This determination may be made by comparing the new sector 914 with the physical page location for storing the cached data, here sector 912. In the example shown, the two sectors of data 912, 914 may be written in the same page. Because they can be written together, the new sector 914 is stored with the cached sector 912 in cache memory 810. A signal is sent to the host indicating that the second sector 914 has been programmed. Generally, sectors are programmable together if they are logically sequential. Because the controller often sends sectors to the memory array sequentially, such received sectors are often programmable in a single page.

FIG. 9C shows another sector of data 916 being received by cache memory 810. The new sector 916 is again compared to the cached data. In this case, there are two sectors 912, 914 already in cache memory 810 that are to be programmed together. If the new sector 916 were to be programmed in the same page with the cached sectors 912, 914, then it would be stored with them in cache memory 810. However, in this example new sector 916 is assigned to a different page in memory array 802. Therefore, sector 916 is not stored with the cached sectors 912, 914.

Because the new sector 916 and the cached data must be programmed separately, the cached data is written to memory array 810. The cache is written to a single page, thus the two sectors 912, 914 stored in cache memory 810 are written to a single page. Writing cache 810 to the memory array 802 empties cache 810. The new sector 916 is then stored in cache 810. The result, shown in FIG. 9C is that two sectors 912, 914 are stored in a single page without additional copying of pages or any additional erase steps. However, potentially even greater saving of space could be achieved. For example, in a page that comprises four sectors, up to four sectors could be programmed together saving as many as three pages of space in the memory array. For bigger page sizes containing more sectors, the potential saving of space in the memory array is even greater.

In this example, programming the two sectors 912, 914 required only one write operation where previously two separate write operations would have been used. Because write operations may be time consuming this may increase the speed of data transfer between the host and the memory system. Also, only one page is used to store the two sectors so that space in the memory array is more efficiently used. Once a sector is stored in cache the host may send another sector where previously the host would wait until a write operation was performed.

FIG. 10A shows programming of sequentially received sectors 101, 102, 103, 104. In this example, the sectors may be programmed together in a single page 106 because they are logically sequential or because the memory system allows non-sequential storage of sectors. Typically, single sectors received from a host are sequential. While four sectors are shown forming a complete page of data in this example, in some cases less than a full page of data may be programmed.

FIG. 10B shows the situation where the host sends a sector of data 107 that is to replace a sector 108 that was previously sent. The new sector 107 and the old sector 108 have the same logical address. New sector 107 may replace old sector 108 in cache 810 without ever writing the cached sector 108 to the memory array. This reduces wear on array 802 and also increases the speed of memory system 800.

FIG. 11 shows another example of using on-chip cache 810. A page of data 111 is first read from the memory array 802 to the cache memory 810. The data from page 111 is then modified while it is in cache memory 810. In this example, the modification is updating one sector of data by replacing the old sector 112 by a new sector 113. In other examples, multiple pages of data may be updated. After the data in cache 810 is modified, the data is written back to memory array 802. In this example, the data is written back to a page 114 having a different location to the page 111 from which it was read. This is because writing to the same location would require an erase operation, which can only be done for an erase block. Because this may involve erasing a large amount of data and take some time, it is generally preferable to write the modified data to a different location. The data may be written to a different location within the same erase block of the memory array or may be written to a different erase block. The controller generally keeps track of where particular data is located in the physical memory by a table or tables that record the logical address to physical address mapping The cache memory of this invention is not limited in size to just one page. A cache memory may store data for several pages. This allows a received sector to be cached for programming to one of several pages. This increases the chances of combining sectors in the cache memory prior to writing to the memory array and thus increases the memory storage performance.

In one embodiment the cache memory may be implemented using the data registers that are employed in certain memory systems. This provides a relatively small, simple cache memory that is on the same chip as the memory array. Thus, the present invention may be implemented without requiring additional hardware. Typically, such registers are comprised of volatile latches. The register or registers connected to a memory array or sub-array typically store data that is equal to the data stored in one row of the memory array or sub-array. In other examples, data for two or more rows of the array are stored in registers. This makes such registers suitable for caching data that is to be programmed to a wide page that extends along a row of the memory array. FIG. 12 shows an example of a memory array 400 having a master register 403 and a slave register 404 that may be used as a cache memory.

A write operation from the cache memory to the memory array may be triggered by different events. One example, described above, is receiving a sector of data that is not programmable with the cached data. Another example is receiving a signal from the host indicating that a write operation is required. Another triggering event is the detection of a low power condition. A low power condition could be detected by a circuit in the memory system. For example, detection of an undervoltage condition (low voltage detection, or LVD) may be used to indicate a low power condition is imminent. Alternatively, the low power condition could be detected by the host and a signal could be sent to the memory system indicating the condition. Low power conditions are a particular problem where memory systems are implemented in removable cards connected to a host. Because such cards generally get their power from the host, removal of the card results in loss of power. If removal of the card occurs when data is stored in a volatile cache, the data may be lost. Thus, some way of detecting a low power condition and saving cached data to the memory array is desirable.

One way to save cached data during a low power condition is to write it to the memory array. Where the cached data is multi-level data, it may be saved as binary data. Typically, binary data is quicker to write than multi-level data and requires less power. Examples of writing both multi-level data and binary data in the same memory array are provided in U.S. Pat. No. 6,717,847, entitled, "Selective operation of a multi-state non-volatile memory system in a binary mode," which patent is hereby incorporated by reference in its entirety. Cached data may be written to a predetermined address in the memory array. When low power is detected, the state machine begins programming the data in cache to the predetermined address in the memory array. No program command is needed. This function may be enabled and disabled by the controller. During power-up the controller checks to see if there is data written at the predetermined address. If there is data there, this indicates to the controller that the data was in cache memory during the last power-down. Thus, the controller can load the data to the cache memory. The data is then erased from the memory array so that the predetermined address is available for subsequent use. If a power-down occurs without data in the cache, no data is written to the predetermined address and upon the subsequent power-up the controller simply verifies that there is no data there and hence no data to restore to the cache memory.

Temporary power may be provided by a power storage device within the memory system such as a capacitor. A signal may be issued by the host that a low power condition is imminent. For example, where the card is secured in the host system, opening a door to access the card may cause the host to signal that a write to the memory array is required. The volatile cache is then written to the memory array before the card is removed from the host.

The cached data may also be written to the memory array after a period of inactivity. Thus, as long as the memory system is receiving data, the cache maintains data that is to be stored in the array. A certain time after data stops arriving from the host, all data remaining in the cache memory is written to the memory array. This prepares the memory system for power loss.

FIG. 13 shows a flowchart for a new command or LVD being received by a controller in a memory system. If the command is a write command 330 then a host sector write sequence 332 is begun for a sector. If the cache is not valid 334 (i.e. if there is no data in the cache) then the sector is transferred to cache 338. If the cache is valid 334 (i.e. there is data in the cache) then the sector is compared to the data in cache to determine whether the sector has a physical address in the cache range 336. For a single-page cache, this means that the sector has been assigned by the controller to the same page in the memory array that the cached data has been assigned to. In general, this also means that the cached data and the sector have logical addresses within the same range. However, in some systems, sectors may be stored together even where there is a logical address gap between them. If the sector is in the cache range then it is stored with the previously cached data in the cache memory 338. If the sector is not in the cache range, a cache flush process is carried out 340. This means that the contents of the cache are programmed to the memory array. When the program operation has been completed 342, the sector is transferred to cache memory. If there is more data to be written 344, then this cycle is repeated for subsequent sectors. If there is no more data to be written, then the system may wait for a predetermined period 346 before flushing the cache 348. Once contents of the cache have been programmed to the non-volatile memory 350, the system waits for a new command 352. When a command is received that is not a write command 330, the cache is flushed 354 and, when the flush is complete 356, it is determined if an LVD has occurred 358. If an LVD has occurred, then the system may enter a sleep mode 360 because the contents of the cache are already saved in non-volatile memory. If an LVD has not occurred, then the new command is processed according to a predefined process for that command 362.

The above description details particular embodiments of the invention. However, the invention is not limited to the embodiments disclosed or to the particular architecture used in the examples given. It will be understood that the invention is entitled to protection within the full scope of the appended claims.

It is claimed:

1. A method of programming an array of non-volatile memory cells having minimum units of program using a cache memory, comprising:
   receiving an addressable data packet having a logical address, wherein each minimum unit of program has a size greater than the addressable data packet;
   selecting a physical location in the array of non-volatile memory cells for storing the addressable data packet;
   recording the physical location for the addressable data packet;
   if there is no cached data in the cache memory, then storing the addressable data packet in the cache memory;
   if there is cached data in the cache memory and if the selected physical location is in a same unit of program of the array of non-volatile memory cells as a selected physical location of cached data, then storing the addressable data packet in the cache memory; and
   if there is cached data in the cache memory and if the selected physical location is not in the same unit of program of the array of non-volatile memory cells as a selected physical location of the cached data, then programming the cached data to the array of non-volatile memory cells and storing the addressable data packet in the cache memory.

2. The method of claim 1 further comprising detecting if a low power condition exists and if such a condition exists then programming the cached data to the array of non-volatile memory cells.

3. The method of claim 1 further comprising programming cached data to the array of non-volatile memory cells after a predetermined period of inactivity.

4. The method of claim 1 wherein the array of non-volatile memory cells is formed on a substrate and the cache memory is formed on the same substrate.

5. The method of claim 1 wherein the addressable data packet is a sector.

6. The method of claim 1 wherein each minimum unit of program has a size that contains four addressable data packets.

7. The method of claim 1 wherein array of non-volatile memory cells has a minimum unit of erase having a size that is greater than each minimum unit of program.

8. The method of claim 1 further comprising sending a signal to a host when the addressable data packet is stored in the cache memory, the signal indicating to the host that programming of the addressable data packet is complete.

9. The method of claim 1 further comprising programming cached data in the cache memory to the array of non-volatile memory cells whenever a host sends a signal that indicates that programming of data stored in the cache memory to the array of non-volatile memory cells is required.

10. The method of claim 1 wherein the cache memory is a volatile memory.

11. The method of claim 1 wherein the cache memory is a non-volatile memory.

12. The method of claim 1 wherein the physical location is recorded in a table that records a logical to physical mapping for the addressable data packet that links the logical address to the physical location.

13. A memory system comprising:
   an array of non-volatile memory cells on a substrate;
   a cache memory on the substrate; and
   a controller for:
      receiving an addressable data packet having a logical address;
      selecting a physical location in the array of non-volatile memory cells for storing the addressable data packet;
      recording the physical location for the addressable data packet;
      if there is no cached data in the cache memory, then storing the addressable data packet in the cache memory;
      if there is cached data in the cache memory and if the selected physical location is in a same unit of program of the array of non-volatile memory cells as a selected physical location of cached data, then storing the addressable data packet in the cache memory; and
      if there is cached data in the cache memory and if the selected physical location is not in the same unit of program of the array of non-volatile memory cells as a selected physical location of the cached data then programming the cached data to the array of non-volatile memory cells and storing the addressable data packet in the cache memory.

14. The memory system of claim 13 wherein the cache memory is comprised of volatile memory.

15. The memory system of claim 13 wherein the cache memory is a non-volatile memory.

16. The memory system of claim 13 further comprising a low power detection circuit for detecting when power supplied to the memory system is low, or may become low, the low power detection circuit being further configured for causing data in the cache memory to be sent to the array-when this condition occurs.

17. The memory system of claim 13 further comprising a connection to a host that is external to the memory system.

18. The memory system of claim 13 wherein the system is in a card, the card having connectors that allow the card to be removably connected to a host.

19. The memory system of claim 13 wherein the array of non-volatile memory cells is a NAND flash memory array.

20. A method of programming a non-volatile memory array having minimum units of programming of a page and minimum units of erase of an erase block, comprising:
receiving an addressable data packet having a logical address from a host, the erase block being larger than a page and a page being larger than the addressable data packet;
selecting a physical address in the non-volatile memory array for writing the addressable data packet;
recording a relationship between the logical address and the physical address;
storing the addressable data packet in a cache memory if the cache memory is empty;
storing a received addressable data packet in a cache memory if there is data in the cache memory and the physical address for writing the data in the cache memory and the physical address for writing the addressable data packet are in a single page of the memory array; and
writing data from the cache memory to the memory array if the physical address for writing data in the cache memory and the physical address for writing the addressable data packet are not in a single page of the memory array.

21. The method of claim 20 further comprising storing the received addressable data packet in the cache memory in place of a previously stored addressable data packet when the received addressable data packet and the previously stored addressable data packet have the same logical address.

22. A method of updating data in a non-volatile memory array, comprising:
reading a page of data from a first physical location in the non-volatile memory into a cache, the page of data containing a plurality of addressable units of data;
receiving a received addressable unit of data and comparing a logical address of the received addressable unit of data with logical addresses of the plurality of addressable units of data of the cache;
if the received addressable unit of data has a logical address that is the logical address of one of the plurality of addressable units of data of the cache, then replacing the one of the plurality of addressable unit of data of the cache with the received addressable unit of data;
subsequently writing contents of the cache to a second physical location in the non-volatile memory array; and
wherein, if the received addressable unit of data has a logical address that is not a logical address of one of the plurality of addressable units of data of the cache, then writing the plurality of addressable units of data of the cache back to a second physical location and subsequently storing the received addressable unit of data in the cache.

23. A method of operating a memory system that includes a volatile memory in communication with a non-volatile memory, the non-volatile memory storing data in multi-level cells, the memory system in communication with a host, comprising:
the memory system receiving a portion of data from the host for storage in the non-volatile memory;
storing the portion of data in the volatile memory;
if a low-power condition is not indicated, then maintaining the portion of data in the volatile memory without copying the portion of data to non-volatile memory and waiting for a subsequent command;
if a low-power condition is indicated, copying the portion of data in the volatile memory to the non-volatile memory and writing the portion of data in the non-volatile memory in binary format in multi-level cells of the non-volatile memory.

24. The method of claim 23 wherein, if a low-power condition is indicated, the portion of data is written to a dedicated portion of the non-volatile memory that is dedicated to storing data from the volatile memory when a low-power condition is indicated.

25. The method of claim 24 further comprising, when the memory system goes from a low-power or power-off condition to a power-on condition, the dedicated portion of the non-volatile memory is examined to determine whether data is stored in the dedicated portion.

26. The method of claim 23 further comprising, if a low-power condition is not indicated, then waiting for a subsequent command for a predetermined period of time, after the predetermined period of time copying the portion of data to the non-volatile memory and writing the portion of data in the non-volatile memory in multi-level format.

* * * * *